US009570988B2

(12) United States Patent
Walker et al.

(10) Patent No.: US 9,570,988 B2
(45) Date of Patent: Feb. 14, 2017

(54) PROGRAMMING CONTROLLER PARAMETERS THROUGH EXTERNAL TERMINALS OF A POWER CONVERTER

(71) Applicant: Power Integrations, Inc., San Jose, CA (US)

(72) Inventors: Clifford James Walker, Fremont, CA (US); David Michael Hugh Matthews, Los Gatos, CA (US)

(73) Assignee: Power Integrations, Inc., San Jose, CA (US)

( * ) Notice: Subject to any disclaimer, the term of this patent is extended or adjusted under 35 U.S.C. 154(b) by 27 days.

(21) Appl. No.: 14/521,077

(22) Filed: Oct. 22, 2014

(65) Prior Publication Data

US 2016/0118896 A1 Apr. 28, 2016

(51) Int. Cl.
*H02M 3/335* (2006.01)
*H02M 3/00* (2006.01)

(52) U.S. Cl.
CPC .......... *H02M 3/33507* (2013.01); *H02M 3/00* (2013.01)

(58) Field of Classification Search
CPC ...................................................... H02H 3/00
USPC ...................................................... 363/21.12
See application file for complete search history.

(56) References Cited

U.S. PATENT DOCUMENTS 4,047,090 A * 9/1977 Chapman et al. ............... 363/34
5,012,808 A * 5/1991 Stubbers et al. ................ 607/58

6,346,801 B1 2/2002 Zafarana et al.
6,364,801 B1 * 4/2002 Asatsuke ................ F16H 61/16
475/119
6,388,853 B1 * 5/2002 Balakrishnan ............ G06F 1/26
324/105

FOREIGN PATENT DOCUMENTS

EP 2528221 A2 11/2012

OTHER PUBLICATIONS

International Patent Application No. PCT/US15/56892—International Search Report and Written Opinion, mailed Jan. 14, 2016, 10 pages.

* cited by examiner

*Primary Examiner* — Adolf Berhane
*Assistant Examiner* — Afework Demisse
(74) *Attorney, Agent, or Firm* — Blakely Sokolof Taylor & Zafman LLP

(57) ABSTRACT

This relates to systems and processes for programming parameters of a controller of a power converter. In one example, a predetermined signal may be applied to the input or output terminals of the power converter to unlock the controller and cause the controller to enter a programming mode. While in the programming mode, one or more additional predetermined signals may be applied to the terminals of the power converter to program one or more parameters of the controller. Once the desired parameters have been programmed, another predetermined signal may be applied to the terminals of the power converter to cause the controller to exit the programming mode and enter a locked mode. The predetermined signals applied to the terminals of the power converter can include an ac or dc signal having a predetermined pattern of changes in frequency, amplitude, and/or magnitude that are applied for a fixed or variable duration.

19 Claims, 4 Drawing Sheets

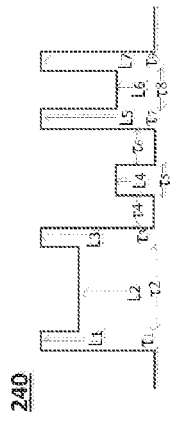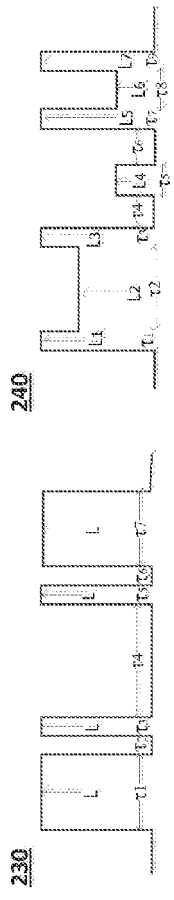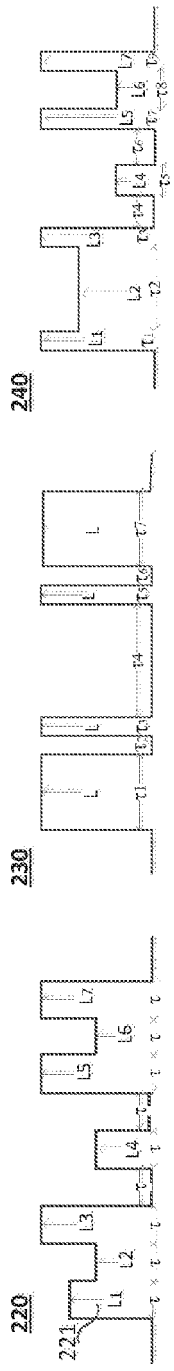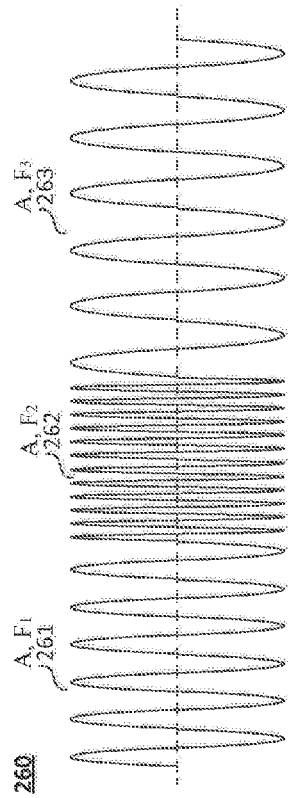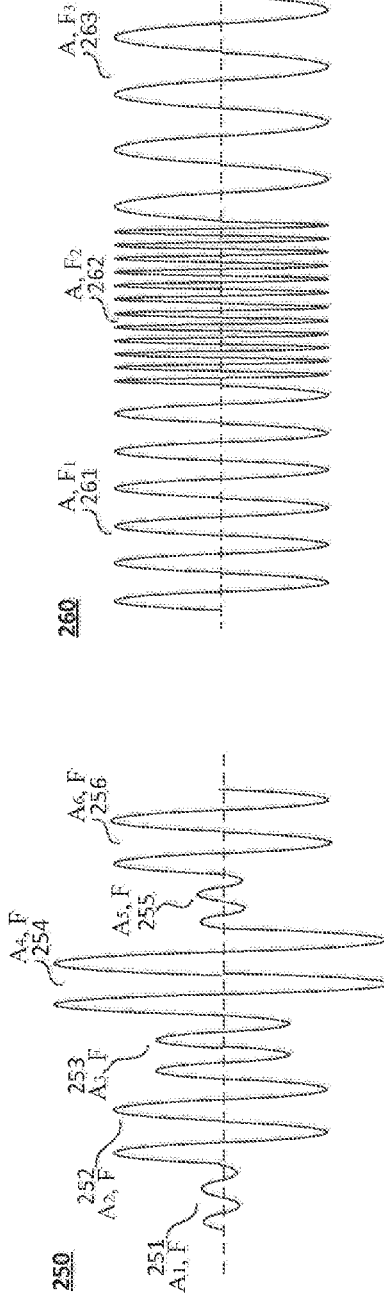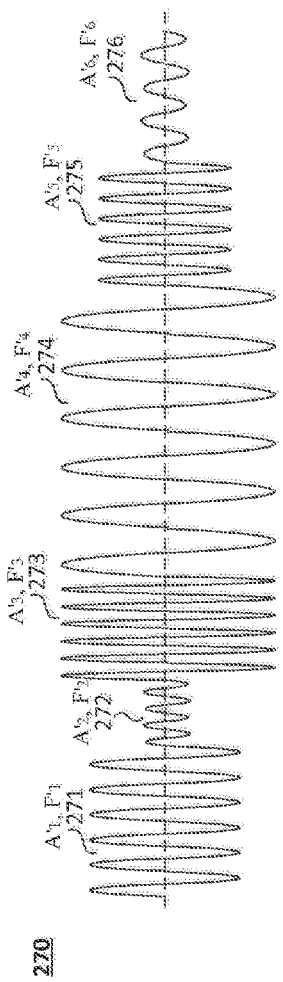

PROGRAMMING CONTROLLER PARAMETERS THROUGH EXTERNAL TERMINALS OF A POWER CONVERTER

BACKGROUND

1. Field

The present disclosure relates generally to power converters and, more specifically, to programming controllers for switched-mode power converters.

2. Related Art

Due to their small size, good output regulation, high efficiency, safety features, and reliable performance, switched-mode power converters are often used to provide a controlled, regulated power in electronic circuits and appliances. Switched-mode power converters may be used to convert an alternating current (ac) source or a high-voltage direct current (dc) source into a regulated dc source having a desired voltage. Based on the specific application, different types of switched-mode power converters with different control methods and different features may be used.

Typically, a switched-mode power converter includes a switching element coupled to an energy transfer element. Common examples of energy transfer elements include a transformer or coupled inductor, where electrical energy received by an input winding on the input side is stored as magnetic energy that may be converted back to electrical energy at the output side. Switched-mode power converters typically include a controller for directing the switching element to be switched between an ON state and an OFF state to control the amount of power transferred through the energy transfer element to achieve output regulation and maintain properties of the output between predefined threshold values. For instance, the controller may be implemented in an integrated circuit (IC) having multiple input and output IC terminals that are configured to receive signals representing information sensed and received from different nodes of the switched-mode power converter. By processing the sensed/received signals, the controller may generate control signals to control the switching element to regulate the output of the power converter. For example, the controller may receive a feedback signal representative of the output voltage and/or current of the power converter and an input sense signal representative of the amplitude, zero-crossing, or frequency of the input voltage. Signals used for protection and selecting a mode of operation may also be received by the controller. Based on these signals, the controller may adjust the switching characteristics (e.g., duty cycle, frequency, etc.) of the switching element or may change the threshold band gaps, the current limit threshold, or the mode of operation to vary the performance of the power converter to control the amount of power transferred to the output of the power converter.

To reduce the design time and manufacturing cost required to provide controllers having customized parameters suitable for a wide range of applications, controllers often have parameters that are designed to be trimmed or programmed based on the application environment and/or customer requirements. For example, U.S. Pat. No. 6,388,853 describes programming a parameter of a controller parameter by injecting signals directly into the terminals of the controller. While controller parameters can be effectively programmed in this way, direct access to the controller terminals is required. As a result, the controller can only be programmed prior to manufacturing and board assembly.

BRIEF DESCRIPTION OF THE FIGURES

Non-limiting and non-exhaustive embodiments are described with reference to the following figures, wherein like reference numerals refer to like parts throughout the various views unless otherwise specified.

FIGS. 2A-F illustrate example signals that can be applied to the input or output terminals of a power converter to program parameters of a controller according to various examples.

DETAILED DESCRIPTION

Figure 1:
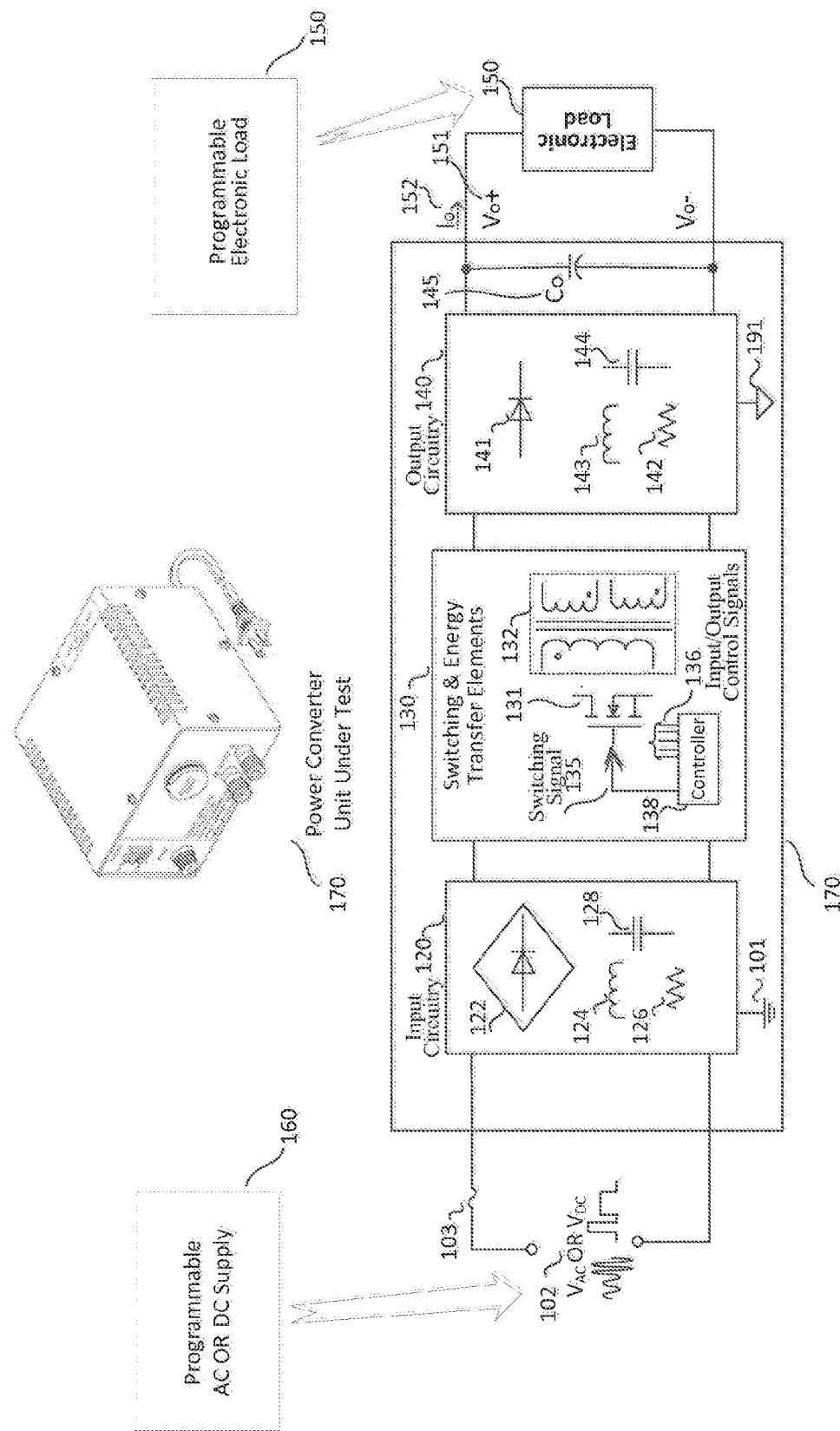
FIG. 1 illustrates a simplified block diagram of an example power converter having a controller that is configured to be programmed through input or output terminals of the power converter according to various examples.

In the following description, numerous specific details are set forth in order to provide a thorough understanding of the present technology. It will be apparent, however, to one having ordinary skill in the art that the specific detail need not be employed to practice the present technology. In other instances, well-known materials or methods have not been described in detail in order to avoid obscuring the present technology.

Reference throughout this specification to "one embodiment", "an embodiment", "one example", or "an example" means that a particular feature, structure or characteristic described in connection with the embodiment or example is included in at least one embodiment of the present disclosure. Thus, appearances of the phrases "in one embodiment", "in an embodiment", "one example", or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

To provide a thorough understanding of the present technology, numerous details have been set forth and, in some cases, simplified equivalent implementation circuits have been described. However, it will be apparent to one having ordinary skill in the art that the equivalent simplified circuits may differ from the actual implementations and that all specific details need not be employed to practice the various examples. Additionally, it should be appreciated that in the description below and in all described examples, a switched-mode power supply may include a controller incorporated into an IC having some or none of the switching and power components in a monolithic or hybrid structure.

This relates to systems and processes for programming parameters of a controller for a power converter. In one example process, a first predetermined signal may be applied to the input or output terminals of the power converter to unlock the controller and cause the controller to enter a programming mode. While the controller is in the programming mode, one or more additional predetermined signals may be applied to the terminals of the power converter to program one or more parameters of the controller. Once the desired parameters have been programmed, a final predetermined signal may be applied to the terminals of the power converter to cause the controller to exit the programming mode and to lock the controller. The predetermined signals applied to the terminals of the power converter can include an ac or dc signal having a predetermined pattern of changes in frequency, amplitude, and/or magnitude that are applied for a fixed or variable duration.

The processes described herein can advantageously be used to program parameters of a controller through terminals of the power converter. As a result, direct access to the terminals of the controller is not required. Thus, programming of the parameters can be performed, for example, at the last stage of manufacturing when the power converter undergoes a final verification testing process after it is assembled and packaged inside an enclosure. This is advantageous because after the power converter is manufactured, it may be determined that, due to manufacturing and/or component tolerances (or any other variable), some parameters of the controller may need adjustment to comply with design specifications and standards requirements. While correction at this stage may not be performed or may be difficult to perform using other programming methods, adjustment of the controller parameters using the systems and processes described herein may readily be performed by applying programming signals to the input or output terminals of the power converter.

FIG. 1 illustrates a simplified block diagram of an example power converter 170 having an undefined general topology. As described in greater detail below, power converter 170 can include a controller 138 configured to be programmed using one or more signals applied to input terminals 102 and/or the output terminals of power converter 170. In some examples, the signals can be provided to power converter 170 using a programmable ac or dc supply and/or a programmable electronic load. In other examples, the signals can be applied manually or using any other desired process.

As shown in FIG. 1, power converter 170 can include input terminals 102 coupled to receive an ac or dc input voltage. For example, power converter 170 can be coupled to receive an ac or dc input voltage from a programmable ac or dc supply 160 at input terminals 102 through fusing element 103. In FIG. 1, power converter 170 is shown as an assembled, enclosed unit. In some examples, power converter 170 can include input circuitry block 120 coupled to input return 101, switching and energy transfer element block 130, and output circuitry block 140 coupled to output return 191. Input circuitry block 120 may include various components, such as input rectification elements 122 and filtering and sensing elements, which may include inductive elements 124, resistive elements 126, and capacitive elements 128. Transfer of energy from input circuitry 120 to output circuitry 140 may occur in switching and energy transfer element block 130. Switching and energy transfer element 130 may include switching element 131, energy transfer element 132 (e.g., an inductor, coupled inductor, or transformer), and controller 138. Controller 138 may be coupled to receive control signal(s) 136 (e.g., an input sense signal, feedback signal, etc.) and may be configured to generate switching signal 135 based on control signal(s) 136 to control switching of switching element 131 to regulate the transfer of energy to the output. Similar to input circuitry 120, output circuitry 140 may include various components, such as output rectification elements 141 and filtering and sensing elements, which may include resistive elements 142, inductive elements 143, and capacitive elements 144. Power converter 170 may further include bulk capacitance Co 145 coupled across the output of power converter 170 to filter any ripple in the output to provide a relatively constant dc output voltage Vo 151 and/or dc output current Io 152 to load 150. In some examples, load 150 can be a programmable electronic load.

As mentioned above, controller 138 may be programmed by applying signals to the input and/or output terminals of power converter 170. These signals can be ac or dc signals having a predetermined pattern of changes in one or more signal characteristics. FIGS. 2A-C illustrate example dc signals that can be applied to the input and/or output terminals of a power converter (e.g., power converter 170 of FIG. 1) to program parameters of a controller (e.g., controller 138) of the power converter. In some examples when applied to the input terminals of the power converter, the signals can be generated by a programmable dc supply. In other examples when applied to the output terminals of the power supply, the signals can be generated by a programmable electronic load. The controller of the power converter can be configured to recognize these predetermined patterns in the received signals and program one or more of its parameters accordingly. For example, the controller can be configured to identify specific sequences of changes in magnitudes of a voltage and/or current signal. It should be appreciated that to avoid accidental programming of the controller parameters, the predetermined patterns in the signals may be complex patterns that are unlikely to occur naturally during normal operation of the power converter.

Graph 220 of FIG. 2A illustrates one example dc signal having a predetermined pattern that can be used to program a controller. In this example, the predetermined pattern in the dc signal can be generated by varying the values of the step pulses representing the voltage, current, or load values of the signal. Specifically, the signal can include a sequence of fixed-duration but variable value step pulses representing voltage, current, or load levels that includes a level L1 applied for a duration τ, a level L2 applied for a duration τ, a level L3 applied for a duration τ, a level of zero applied for a duration τ, a level L4 applied for a duration τ, a level of zero applied for a duration τ, a level L5 applied for a duration τ, a level L6 applied for a duration τ, and a level L7 applied for a duration τ. In this example, the duration τ for each applied level can be the same. The levels L1-L7 can all be the same, can all be different, or some can be the same and some can be different. It should be appreciated that FIG. 2A shows just one example signal having predetermined sequence of more than two voltage, current, or load values applied for a fixed length of time and that any other sequence of varying voltage, current, or load values can be used.

Graph 230 of FIG. 2B illustrates another example dc signal having a predetermined pattern that can be used to program a controller. In this example, the predetermined pattern in the dc signal can be generated by varying the durations of the step pulses representing the voltage, current, or load values of the signal. Specifically, the signal can include a sequence of fixed-value but variable-duration step pulses representing voltage, current, or load levels that includes a level L applied for a duration τ1, a level of zero applied for a duration τ2, a level L applied for a duration τ3, a level of zero applied for a duration τ4, a level L applied for a duration τ5, a level of zero applied for a duration τ6, and a level L applied for a duration τ7. In this example, the level L for each applied level can be the same. The durations τ1-τ6 can all be the same, can all be different, or some can be the same and some can be different. It should be appreciated that FIG. 2B shows just one example signal having a predetermined sequence of two voltage, current, or load values applied for a variable length of time and that any other sequence of voltage, current, or load values applied for different lengths of time can be used.

Graph 240 of FIG. 2C illustrates another example dc signal having a predetermined pattern that can be used to program a controller. In this example, the predetermined pattern in the dc signal can be generated by varying both the durations and values of the step pulses representing the voltage, current, or load values of the signal. Specifically, the signal can include a sequence of variable-duration and variable-value step pulses representing voltage, current, or load levels that includes a level L1 applied for a duration $\tau 1$, a level L2 applied for a duration $\tau 2$, a level L3 applied for a duration $\tau 3$, a level of zero applied for a duration $\tau 4$, a level L4 applied for a duration $\tau 5$, a level of zero applied for a duration $\tau 6$, a level L5 applied for a duration $\tau 7$, a level L6 applied for a duration $\tau 8$, and a level L7 applied for a duration $\tau 9$. In this example, the durations $\tau 1$-$\tau 9$ can be all the same, can be all different, or some can be the same and some can be different. Similarly, the levels L1-L7 can all be the same, can all be different, or some can be the same and some can be different. It should be appreciated that FIG. 2C shows just one example signal having predetermined sequence of more than voltage or current values applied for a variable-duration and that any other sequence of varying voltage or current values applied for different lengths of time can be used.

In other examples, the signals used to program the controller can be ac signals. FIGS. 2D-F show example ac signals that can be applied to the input terminals of a power converter to program parameters of the controller of the power converter. In some examples, the signals can be generated by a programmable ac supply. The controller of the power converter can be configured to recognize these predetermined patterns in the received signals and program one or more of its parameters accordingly. For example, the controller can be configured to identify specific sequences of changes in amplitude and/or frequency of an ac voltage or current signal. It should be appreciated that to avoid accidental programming of the controller parameters, the predetermined patterns in the signals may be complex patterns that are unlikely to occur naturally during normal operation of the power converter.

Graph 250 of FIG. 2D illustrates one example ac signal having a predetermined pattern that can be used to program a controller. In this example, the predetermined pattern in the ac signal can be generated by varying the amplitude of the signal. Specifically, the signal can include a portion 251 having amplitude A1 and frequency F, portion 252 having amplitude A2 and frequency F, portion 253 having amplitude A3 and frequency F, portion 254 having amplitude A4 and frequency F, portion 255 having amplitude A5 and frequency F, and portion 256 having amplitude A6 and frequency F. Each portion 251-256 can have the same or different duration. Also, the frequency F for each portion can be the same, while the amplitudes A1-A6 can all be the same, can all be different, or some can be the same and some can be different. It should be appreciated that FIG. 2D shows just one example ac signal having a fixed-frequency and a predetermined sequence of varying amplitudes and that any other sequence of varying voltage or current amplitudes can be used.

Graph 260 of FIG. 2E illustrates another example ac signal having a predetermined pattern that can be used to program a controller. In this example, the predetermined pattern in the ac signal can be generated by varying the frequency of the signal. Specifically, the signal can include a portion 261 having amplitude A and frequency F1, portion 262 having amplitude A and frequency F2, and portion 263 having amplitude A and frequency F3. Each portion 261-263 can have the same or different duration. Also, the amplitude A for each portion can be the same, while the frequencies F1-F3 can all be the same, can all be different, or some can be the same and some can be different. It should be appreciated that FIG. 2E shows just one example ac signal having a fixed-amplitude and a predetermined sequence of varying frequencies and that any other sequence of varying voltage or current frequencies can be used.

Graph 270 of FIG. 2F illustrates another example ac signal having a predetermined pattern that can be used to program a controller. In this example, the predetermined pattern in the ac signal can be generated by varying both the amplitude and the frequency of the signal. Specifically, the signal can include a portion 271 having amplitude A'1 and frequency F'1, portion 272 having amplitude A'2 and frequency F'2, portion 273 having amplitude A'3 and frequency F'3, portion 274 having amplitude A'4 and frequency F'4, portion 275 having amplitude A'5 and frequency F'5, and portion 276 having amplitude A'6 and frequency F'6. Each portion 271-276 can have the same or different duration. The amplitudes A'1-A'6 can all be the same, can all be different, or some can be the same and some can be different. Similarly, the frequencies F'1-F'6 can all be the same, can all be different, or some can be the same and some can be different. It should be appreciated that FIG. 2F shows just one example ac signal having a predetermined sequence of varying frequencies and amplitudes and that any other sequence of varying voltage or current frequencies and amplitudes can be used.

In some examples, the controller may be operated in a programming mode and a locked mode. While in the programming mode, parameters of the controller may be set by inputting one or more signals having a predetermined pattern (e.g., similar to those shown in FIGS. 2A-F). While in the locked mode, the parameters may not be adjusted. In these examples, the controller may require an unlocking signal having a predetermined pattern to be entered in order to cause the controller to transition from the locked mode to the programming mode. Similarly, the controller may require a locking signal having a predetermined pattern to be entered in order to cause the controller to exit the programming mode and to enter the locked mode. In some examples, the controller may transition between the locked mode and the programming mode any number of times. In other examples, once the controller exits the programming mode to reenter the locked mode, it may remain in the locked mode permanently to prevent accidental and unintentional changes to the controller parameters.

Figure 3A:
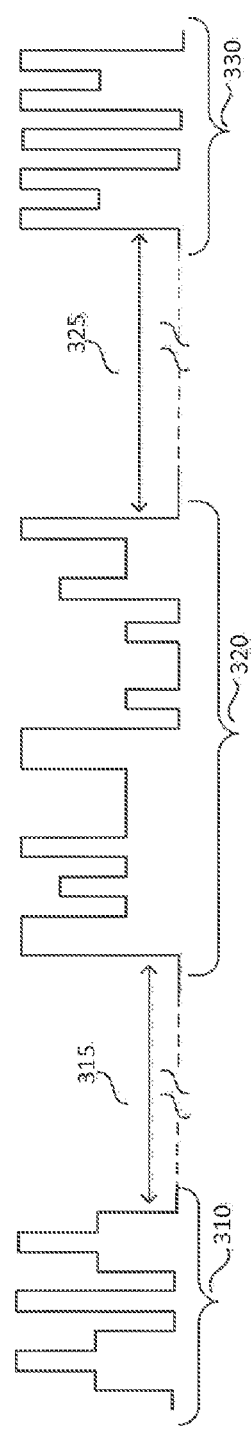
FIGS. 3A and B illustrate example sequences of signals that can be applied to the input or output terminals of a power converter to program parameters of a controller according to various examples.

To illustrate, FIG. 3A shows one example dc signal sequence that can be applied to the input and/or output terminals of a power converter to unlock the controller and cause it to enter the programming mode, to program a controller parameter, and to lock the controller and cause it to enter the locked mode. As shown, the signal sequence can include a first unlock signal 310 having a first predetermined pattern. In this example, first signal 310 is similar to the signal shown in graph 220 of FIG. 2A in that it includes a sequence of fixed-duration but variable value step pulses representing voltage, current, or load levels. This pattern can be a predetermined pattern that is to be interpreted by the controller as a request to unlock the device and/or to identify a specific parameter to be programmed. The signal sequence can further include a delay period 315 after first signal 310 during which no pattern is presented in order to give the controller a sufficient length of time to enter the programming mode. The signal sequence can further include a second programming signal 320 having a second predetermined pattern. This pattern can be a predetermined pattern that is to be interpreted by the controller as a request to set a parameter identified by first signal 310 to a specific value or to set a specific parameter to a specific value. In this example, second signal 320 is similar to the signal shown in graph 230 of FIG. 2B in that it includes a sequence of fixed-value but variable-duration step pulses representing voltage, current, or load levels. The signal sequence can further include a second delay period 325 during which no pattern is presented in order to give the controller a sufficient length of time to change the controller parameter. The signal sequence can further include third locking signal 330 having a third predetermined pattern. This pattern can be a predetermined pattern that is to be interpreted by the controller as a request to lock the device. Signal 330 can be similar to the signal shown in graph 220 of FIG. 2A in that it includes a sequence of fixed-duration but variable value step pulses representing voltage, current, or load levels. It should be appreciated that FIG. 3A illustrates just one example sequence of dc signals that can be applied to the input or output terminals of the power converter and that the sequence can include any dc signal having variable values of step pulses (e.g., similar to that shown in graph 220 of FIG. 2A), variable durations of step pulses (e.g., similar to that shown in graph 230 of FIG. 2B), or having both varying values and durations of step pulses (e.g., similar to that shown in graph 240 of FIG. 2C).

Figure 3B:
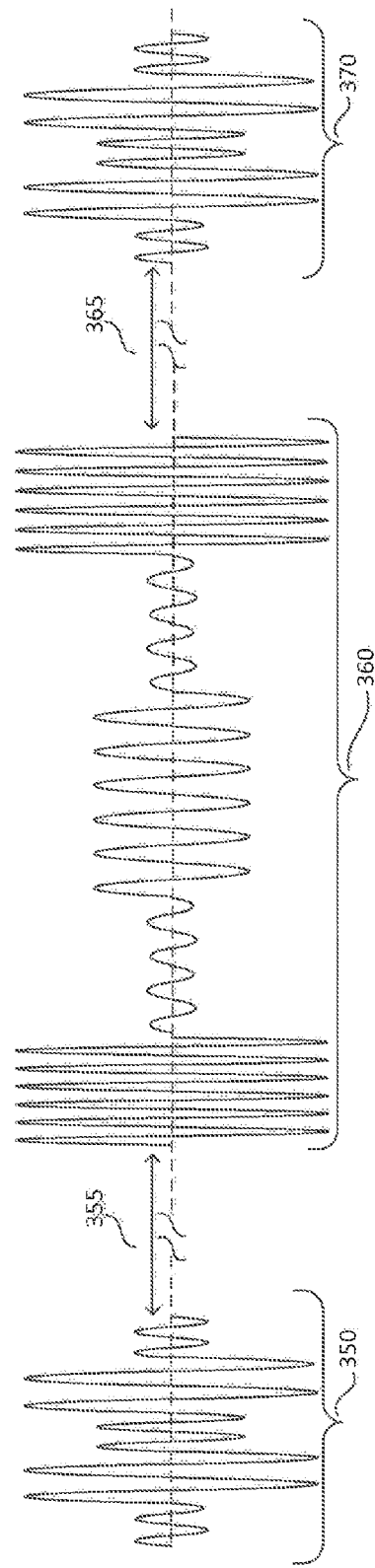

FIG. 3B shows one example ac signal sequence that can be applied to the input and/or output terminals of a power converter to unlock the controller and cause it to enter the programming mode, to program a controller parameter, and to lock the controller and cause it to enter the locked mode. As shown, the signal sequence can include a first unlock signal 350 having a first predetermined pattern. In this example, first signal 350 is similar to the signal shown in graph 250 of FIG. 2D in that it includes a fixed-frequency signal having a variable amplitude. This pattern can be a predetermined pattern that is to be interpreted by the controller as a request to unlock the device and/or to identify a specific parameter to be programmed. The signal sequence can further include a delay period 355 after first signal 350 during which no pattern is presented in order to give the controller a sufficient length of time to enter the programming mode. The signal sequence can further include a second programming signal 360 having a second predetermined pattern. This pattern can be a predetermined pattern that is to be interpreted by the controller as a request to set a parameter identified by first signal 350 to a specific value or to set a specific parameter to a specific value. In this example, second signal 360 is similar to the signal shown in graph 270 of FIG. 2F in that it includes an ac signal having both a variable frequency and amplitude. The signal sequence can further include a second delay period 365 during which no pattern is presented in order to give the controller a sufficient length of time to change the controller parameter. The signal sequence can further include third locking signal 370 having a third predetermined pattern. This pattern can be a predetermined pattern that is to be interpreted by the controller as a request to lock the device. Signal 370 can be similar to the signal shown in graph 250 of FIG. 2D in that it includes a fixed-frequency signal having a variable amplitude. It should be appreciated that FIG. 3B illustrates just one example sequence of ac signals that can be applied to the input terminals of the power converter and that the sequence can include any ac signal having variable amplitudes (e.g., similar to that shown in graph 250 of FIG. 2D), variable frequencies (e.g., similar to that shown in graph 260 of FIG. 2E), or variable amplitudes and frequencies (e.g., similar to that shown in graph 270 of FIG. 2F).

It should also be appreciated that the sequence of signal used to program the controller can include a combination of both ac and dc signals. For example, one example sequence of signals can include dc signal 310 to unlock the controller, dc signal 320 and ac signal 360 to program two different parameters of the controller, and ac signal 370 to lock the controller. Moreover, it should be appreciated that some of the signals within a sequence of signals may be applied to the input terminals of the power converter and others applied to the output terminals of the power converter. In some examples, a particular signal can be interpreted the same regardless of whether it is received at the input terminals of the power converter or the output terminals of the power converter. In other examples, a particular signal may be interpreted one way when applied to the input terminals of the power converter and interpreted in another way when applied to the output terminals of the power converter.

Figure 4:
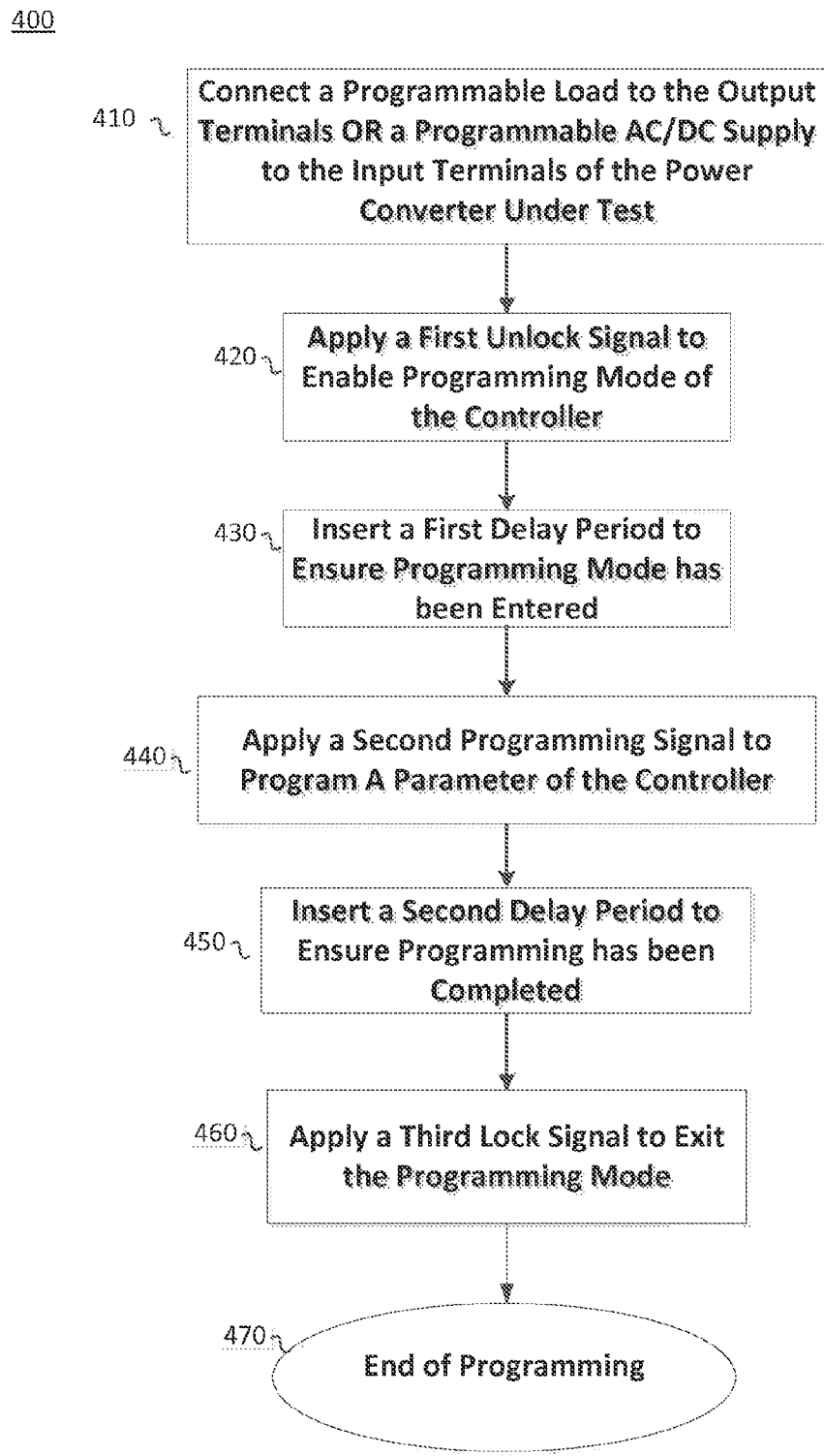
FIG. 4 illustrates an example process for programming a controller by applying a sequence of signals to the input or output terminals of a power converter according to various examples.

FIG. 4 illustrates an example process 400 for programming a controller through the input and/or output terminals of a power converter in which it is installed. In some examples, process 400 can be performed after assembly of the power converter at the last stage of manufacturing, during testing and verification, or at a customer site during live operation of the power converter.

At block 410, a programmable/adjustable load (e.g., an electronic load) may be connected to the output terminals of the power converter or a programmable/adjustable ac/dc supply may be connected to the input terminals of the power converter. In some examples where an output cable drop should be considered and included in output voltage adjustments, the programmable load may be coupled to the end of the power converter output cable rather than the output terminals of the power converter.

At block 420, the programmable supply or load may be used to unlock the controller and cause the controller to enter a programming mode by applying a signal having a predetermined pattern to the input or output terminals of the power converter. The signal can be an ac or dc signal having varying amplitudes, frequencies, durations, or the like, similar to those shown in FIGS. 2A-F. For example, a signal similar to signal 310 or 350 may be applied to the input or output terminals of the power converter. The signal can be a unique signal that is to be interpreted by the controller as a request to unlock the device. In some examples, the signal can instruct the controller to enter a programming mode for all possible parameters that are capable of being programmed. In other examples, the signal can instruct the controller to enter a programming mode for a specific parameter to allow only that one parameter to be adjusted.

In some examples, the signals applied to the input or output terminals of the power converter may be detected by the controller due to changes in the feedback signal, error signal, current limit, pulse width/duty cycle, switch ON time/OFF time, skipped pulses, over-voltage control signal, or any other internal input to the controller based on the topology of the power converter.

After entering the signal to unlock the controller at block 420, a delay period may be inserted at block 430 to provide the controller with a sufficient amount of time to enter the programming mode. For example, a delay period similar to delay period 315 or 355 may be inserted. At block 440, the programmable supply or load may be used to program one or more parameters of the controller by applying a signal having a predetermined pattern to the input or output terminals of the power converter. The signal can be an ac or dc signal having varying amplitudes, frequencies, durations, or the like, similar to those shown in FIGS. 2A-F. For example, a signal similar to signal 320 or 360 may be applied to the input or output terminals of the power converter. In some examples, this signal can include a predetermined pattern that is to be interpreted by the controller as a request to set a parameter identified by the unlock signal applied at block 420 to a specific value (e.g., the signal applied at block 440 can represent a state or value) or can include a predetermined pattern that is to be interpreted by the controller as a request to set a specific parameter to a specific value (e.g., the signal can represent a state or value for a specific parameter). Any number of programming signals can be applied to the input or output terminals of the power converter to program any number of parameters of the controller.

Some example types of controller parameters that can be programmed at block 440 can include, but are not limited to, an input voltage range, an output voltage range, an input current range, an output current range, an oscillator frequency, a voltage drop compensation, a switching characteristic of a switching element of the power converter, a current limit threshold, an input over-voltage threshold, an output over-voltage threshold, an over temperature threshold, a parameter setting a power converter output current regulation threshold, a parameter setting a power converter output voltage regulation threshold, an output cable type, an output cable impedance, a band gap tolerance, a compensation for tolerance and parasitic in a controller circuit block, or any other feature or mode of the power converter that can be programmed through the controller.

After entering the signal(s) to program the parameter(s) of the controller at block 440, a second delay period may be inserted at block 450 to provide the controller with a sufficient length of time to set the values of the parameters according to the received signals. For example, a delay period similar to delay period 325 or 365 may be inserted. At block 460, the programmable supply or load may be used to lock the controller and cause it to exit the programming mode by applying a signal having a predetermined pattern to the input or output terminals of the power converter. For example a signal similar to signal 330 or 370 may be applied to the input terminals or output terminals of the power converter. The signal can be an ac or dc signal having varying amplitudes, frequencies, durations, or the like, similar to those shown in FIGS. 2A-F. At block 470, programming of the controller can end.

In some examples, once the controller exits the programming mode due to the locking signal applied at block 460, the controller may remain in a locked mode in which it can no longer enter the programming mode again. As a result, further changes to the controller parameters may be prohibited. In some examples where the controller enters the programming mode for all parameters, the controller may prevent further changes to all controller parameters once the controller exits the programming mode. In other examples where the controller enters the programming mode for individual or subsets of all parameters, the controller may prevent further changes to on those controller parameters once the controller exits the programming mode. In other examples, the controller may transition between the programming mode and locked mode any number of times.

While process 400 is described above as using a programmable ac/dc supply or programmable load, it should be appreciated that process 400 can similarly be performed using a manual or other input process. For example, a user may manually change the voltages, currents, or loads applied to the input or output terminals of the device.

Process 400 can advantageously be used to program a controller of a power converter through the input or output terminals of the power converter. Thus, process 400 can be performed without direct access to the terminals of the controller. This allows a controller to be programmed during late stages of manufacture, such as when the power converter undergoes a final verification testing process after it is assembled and packaged inside an enclosure. This is advantageous because after the power converter is manufactured, it may be determined that, due to manufacturing and/or component tolerances (or any other variable), some parameters of the controller may need adjustment to comply with design specifications and standards requirements. While correction at this stage may not be performed or may be difficult to perform using other programming methods, adjustment of the controller parameters using process 400 may readily be performed by applying programming signals to the input or output terminals of the power converter.

The above description of illustrated examples of the present technology, including what is described in the Abstract, are not intended to be exhaustive or to be limitation to the precise forms disclosed. While specific embodiments of, and examples for, the present technology are described herein for illustrative purposes, various equivalent modifications are possible without departing from the broader spirit and scope of the present technology. Indeed, it is appreciated that the specific example voltages, currents, frequencies, power range values, times, etc., are provided for explanation purposes and that other values may also be employed in other embodiments and examples in accordance with the teachings of the present technology.

What is claimed is:

1. A method for programming a controller of a power converter, wherein the method comprises:
    causing the controller to enter a programming mode by applying a first predetermined signal to one or more terminals of the power converter,
        wherein the one or more terminals of the power converter includes one or more input terminals of the power converter or one or more output terminals of the power converter,
        wherein the one or more input terminals of the power converter are adapted to be coupled to a programmable ac or dc supply, and
        wherein the one or more output terminals of the power converter are adapted to be coupled to a programmable electronic load;
    programming one or more parameters of the controller by applying a second predetermined signal to the one or more terminals of the power converter; and
    causing the controller to exit the programming mode by applying a third predetermined signal to the one or more terminals of the power converter.

2. The method of claim 1, wherein each of the first, second, and third predetermined signal patterns comprises generating a respective plurality of output current pulses wherein applying each of the first, second, and third predetermined signals to the one or more terminals of the power converter comprises varying either:

amplitudes,
durations,
or both amplitudes and durations
of the output current pulses within each of the respective plurality of output current pulses.

3. The method of claim 1, wherein each of the first, second, and third predetermined signals comprises generating a respective plurality of output voltage pulses wherein applying each of the first, second, and third predetermined signals to the one or more terminals of the power converter comprises varying either:
amplitude,
duration,
or both amplitude and duration
of the output voltage pulses within each of the respective plurality of output current pulses.

4. The method of claim 1, wherein applying each of the first, second, and third predetermined signals to the one or more terminals of the power converter comprises generating a respective plurality of ac input voltage sequences wherein applying each of the first, second, and third predetermined signals to the one or more terminals of the power converter comprises varying either:
amplitude,
frequency,
or both amplitude and frequency
of the respective ac input voltage sequences in accordance with a respective predetermined pattern.

5. The method of claim 1, wherein each of the first, second, and third predetermined signals comprises a dc input voltage.

6. The method of claim 5, wherein applying each of the first, second, and third predetermined signals to the one or more terminals of the power converter comprises generating a respective plurality of input voltage pulses wherein applying each of the first, second, and third predetermined signals to the one or more terminals of the power converter comprises varying either:
amplitude,
duration,
or both amplitude and duration
of the respective input voltage pulses in accordance with a respective predetermined pattern.

7. The method of claim 1, wherein the one or more parameters of the controller comprises an input voltage range, an output voltage range, an input current range, an output current range, an oscillator frequency, a voltage drop compensation, a switching characteristic of a switching element of the power converter, a current limit threshold, an input over-voltage threshold, an output over-voltage threshold, an over temperature threshold, a parameter setting of a power converter output current regulation threshold, a parameter setting of a power converter output voltage regulation threshold, an output cable type, an output cable impedance, a band gap tolerance, or a compensation for tolerance and parasitic in a controller circuit block.

8. The method of claim 1, wherein after applying the third predetermined signal to the one or more terminals of the power converter, entry into the programming mode is prevented by the controller.

9. A controller for a power converter, wherein the controller is configured to:
enter a programming mode in response to a first predetermined signal being applied to one or more terminals of the power converter,
wherein the one or more terminals of the power converter includes one or more input terminals of the power converter or one or more output terminals of the power converter,
wherein the one or more input terminals of the power converter are adapted to be coupled to a programmable ac or dc supply, and
wherein the one or more output terminals of the power converter are adapted to be coupled to a programmable electronic load;
program one or more parameters of the controller in response to a second predetermined signal being applied to the one or more terminals of the power converter; and
exit the programming mode in response to a third predetermined signal being applied to the one or more terminals of the power converter.

10. The controller of claim 9, wherein each of the first, second, and third predetermined signals comprises an output current.

11. The controller of claim 10, wherein each of the first, second, and third predetermined signals comprises generating a respective plurality of output current pulses wherein applying each of the first, second, and third predetermined signals to the one or more terminals of the power converter comprises varying either:
amplitude,
duration,
or both amplitude and duration
of the output current pulses within each of the respective plurality of output current pulses.

12. The controller of claim 9, wherein each of the first, second, and third predetermined signals comprises an output voltage.

13. The controller of claim 12, wherein a respective output voltage of each of the first, second, and third predetermined signals comprises generating a respective plurality of output voltage pulses wherein applying each of the first, second, and third predetermined signals to the one or more terminals of the power converter comprises varying either:
amplitude,
duration,
or both amplitude and duration
of the output voltage pulses within each of the respective plurality of output voltage pulses.

14. The controller of claim 9, wherein each of the first, second, and third predetermined signals comprises an ac input voltage.

15. The controller of claim 14, wherein a respective ac input voltage of each of the first, second, and third predetermined signals comprises generating a respective plurality of ac input voltage sequences wherein applying each of the first, second, and third predetermined signals to the one or more terminals of the power converter comprises varying either:
amplitude,
frequency,
or both amplitude and frequency
of the respective ac input voltage sequences in accordance with a respective predetermined pattern.

16. The controller of claim 9, wherein each of the first, second, and third predetermined signals comprises a dc input voltage.

17. The controller of claim 16, wherein a respective dc input voltage of each of the first, second, and third predetermined signals comprises generating a respective plurality of input voltage pulses wherein applying each of the first, second, and third predetermined signals to the one or more terminals of the power converter comprises varying either:
   amplitude,
   duration,
   or both amplitude and duration
      of the respective input voltage pulses in accordance with a respective predetermined pattern.

18. The controller of claim 9, wherein the one or more parameters of the controller comprises an input voltage range, an output voltage range, an input current range, an output current range, an oscillator frequency, a voltage drop compensation, a switching characteristic of a switching element of the power converter, a current limit threshold, an input over-voltage threshold, an output over-voltage threshold, an over temperature threshold, a parameter setting a power converter output current regulation threshold, a parameter setting a power converter output voltage regulation threshold, an output cable type, an output cable impedance, a band gap tolerance, or a compensation for tolerance and parasitic in a controller circuit block.

19. The controller of claim 9, wherein the controller is further configured to prevent entry into the programming mode after exiting the programming mode in response to the third predetermined signal being applied to the one or more terminals of the power converter.

* * * * *